United States Patent Office 3,621,554

Patented Nov. 23, 1971

3,621,554

APPARATUS FOR SETTING ELECTRIC COMPONENTS INTO PRINTED CIRCUIT BOARDS

Gustav Feldman, 263 Roosevelt Blvd., Long Beach, N.Y. 11561, and Charles Winkler, 21 Devon St., Malverne, N.Y. 11565

Filed May 19, 1969, Ser. No. 825,529
Int. Cl. H05k 3/30
U.S. Cl. 29—203 9 Claims

ABSTRACT OF THE DISCLOSURE

The method for setting a variety of types of electronic components in duplicates of a printed circuit board and apparatus for practicing the method; such apparatus consisting of an illuminated open-top box with a light-diffusing rigid pane set into its open top, a frame for supporting a circuit board above the pane, and an opaque film reciprocally movably mounted on the box between the pane and the board support. The film is first made into a template by perforating different areas thereof, with the perforations of each area conforming in arrangement to the lead wire openings for one component type, by passing a film perforating tool through the appropriate openings of the prototype board and then using the template film to set appropriate component lead wires through board openings registering with illuminated perforations of each template film area as the areas are successively moved under a duplicate board.

The present invention relates to methods and apparatus for guiding the setting of electronic components and their terminals and lead wires into printed circuit plates or boards.

Industrially, printed circuit boards for each circuit used in electrical or electronic devices or apparatus are duplicated in large numbers. Each printed circuit board is generally formed to receive one or more of a variety of types of electronic components; each type of which may have a different number or differently arranged lead wires than the other components used in the same circuit. Each circuit board is provided with perforations wherethrough the lead or terminal wires of the various components may be passed through from one side of the board to the other, on the latter side of which the lead wires are connected into the circuit of the board. Since the different types of components are closely spaced on the printed circuit board, the openings for their lead wires are likewise closely spaced and present a confusing array that makes it a difficult and slow process, requiring great skill and knowledge on the part of the worker, to accurately set the components into the board with their lead wires extending through the proper perforations intended for them. Consequently, the production of completely printed circuit boards has heretofore been a slow, laborious and costly process and added greatly to the cost of the products into which they are incorporated.

The present invention is directed to devising a method and the provision of a device or apparatus for its practice, whereby the assembling procedure of components for a printed circuit board with the board may be simplified, facilitated, and greatly speeded with the attainment, at the same time, of great accuracy.

It is also an object of the present invention to devise methods and provide apparatus, of the character described, which will enable the easy and rapid setting of the electronic components on a printed circuit board in accurate location and with safety against dropping out or off therefrom.

It is another object of the present invention to devise methods, and provide apparatus, of the character described, whereby the electronic components may be set on a printed circuit board with their lead wires folded or bent in the direction required for their connection in the circuit of the board, to eliminate the need for manually bending them in that direction and still further speed the formation of the circuit.

It is still another object of the present invention to devise methods and provide apparatus, of the character described, which may be practiced and used with rapidity and accuracy by labor having a minimum of skill and training and even without any education whatever.

It is a further object of the present invention to provide apparatus, of the character described, which may be utilized in all steps of the method; which is of relatively simple construction and economical to produce, and which may be readily adjusted for use on printed circuit boards of any size or shape and for components having terminal or lead wires of varying length.

The foregoing and other objects and advantages of the method and apparatus for guiding the setting of electronic components and terminals into printed circuit boards will become more readily apparent to those skilled in the art from the embodiments thereof shown in the accompanying drawings, and from the description following. It is to be understood, however, that such embodiments are shown by way of illustration only, to make the practice and principles of the invention more readily comprehensible, and without any intent of limiting the invention to the specific details therein shown.

Figure 1:
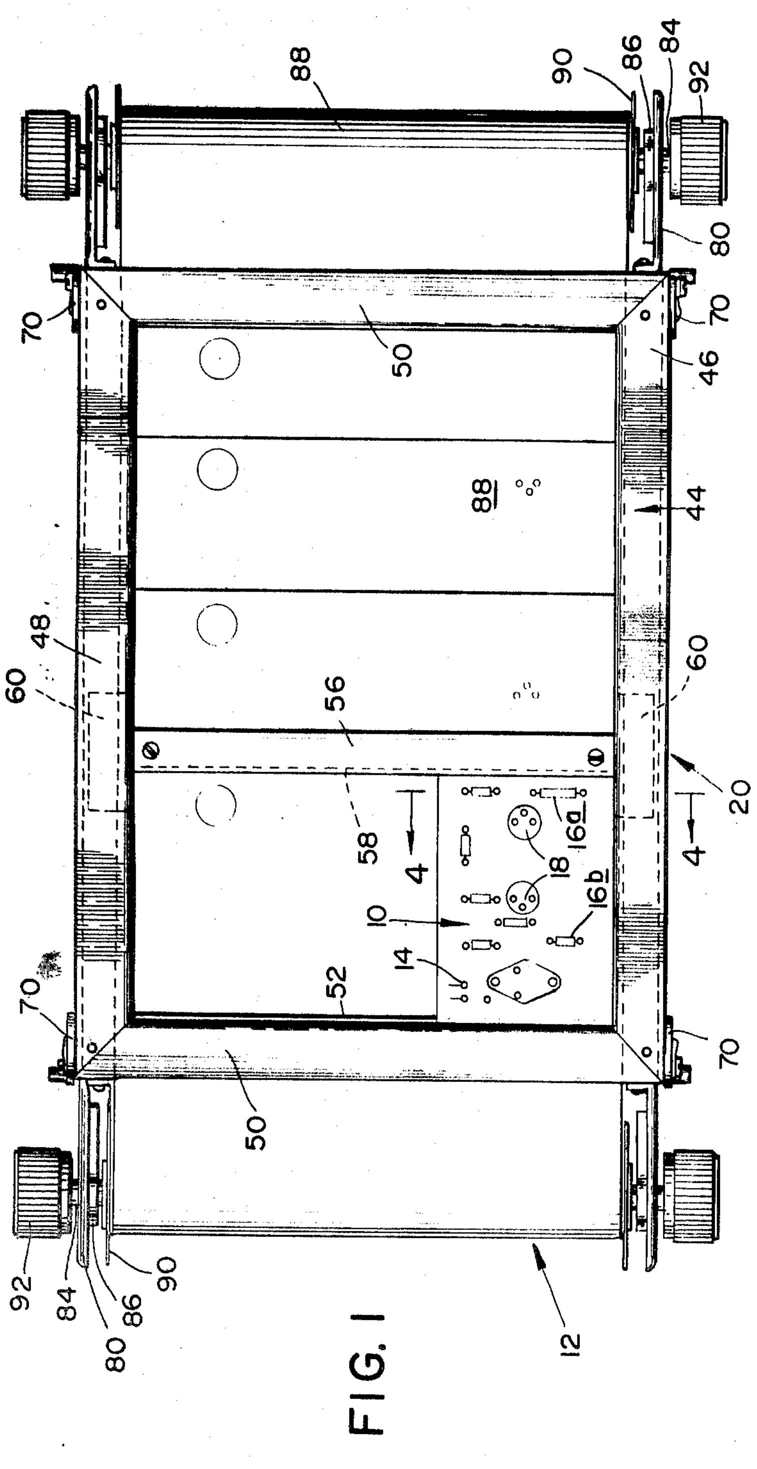
FIG. 1 is a top plan view of the apparatus of the invention.
Figure 3:
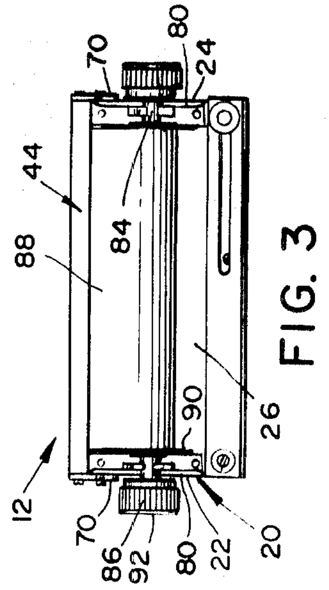
FIGS. 2 and 3 are, respectively, side and end elevations of the same.
Figure 2:
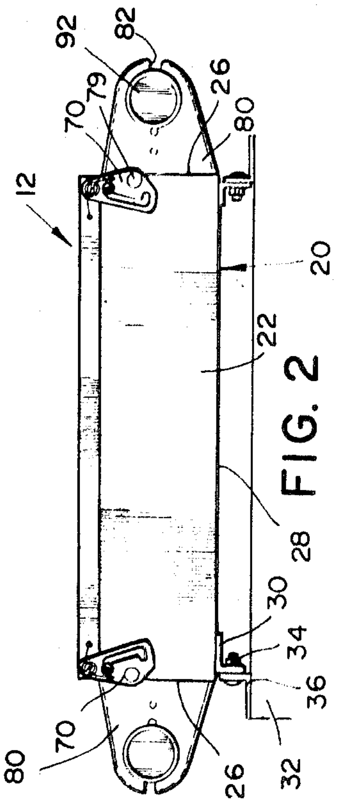

Generally stated, the invention consists in forming an opaque masking film arranged for movement over a source of light, the film having groups of perforations or holes formed therein each group formed in a separate section of the film; the perforations in each group corresponding to the location of the terminal or lead openings of the components of each group of the same type to be set into a specific printed circuit board, so that when such board is held over the film with the section having one group of film opening underlying the board, the light passing through such group of openings will be visible only to the corresponding openings in the board into which the leads of the corresponding components may then be set, when such openings in the board are alined with the openings in the film.

In an advanced form of the apparatus of the invention, means in the form of a transparent plate, such as glass, are provided immediately below the circuit board supporting means in position to divert the lead wires of the components set into the board in a lateral direction to inhibit the dropping out or off the board when removed from the apparatus.

In a still more sophisticated form of the apparatus, an individual glass is provided for each type of printed circuit board; the surface of the glass having grooves, formed by etching or otherwise, one end of which lies in register with each lead-receiving opening of the board, each groove extending in the direction required to be taken by the lead wire passed through the registering opening required for the connection of said lead in the circuit of the board.

It is an advantage of the invention that the master or masking guide-film may be formed on the same apparatus as that on which the printed circuit boards are to be thereafter assembled with their components.

Referring now in greater detail to the drawings illustrating the apparatus of the invention, the reference numeral 10 designates, generally, a more or less diagrammatically shown printed circuit board, and the numeral 12, generally, designates one embodiment of the apparatus used in the assembly of the board with the appropriate electronic components.

The board 10 is shown as arranged to receive in its printed circuit the lead wires or terminals of a plurality of different components inserted through holes of appropriate number and arrangement for each component. Thus, numeral 14 designates the position of a component having a single terminal or lead wire and a single wire-receiving hole; **16*a* designates the position of a two-lead component, of one size, having two lead-receiving holes; 16*b* designates the position of a two-lead component of a smaller size, and 18** designates the position of a component having three terminal leads, with three openings arranged and located to receive them.

Figures 4, 5, 6, 7, 8:
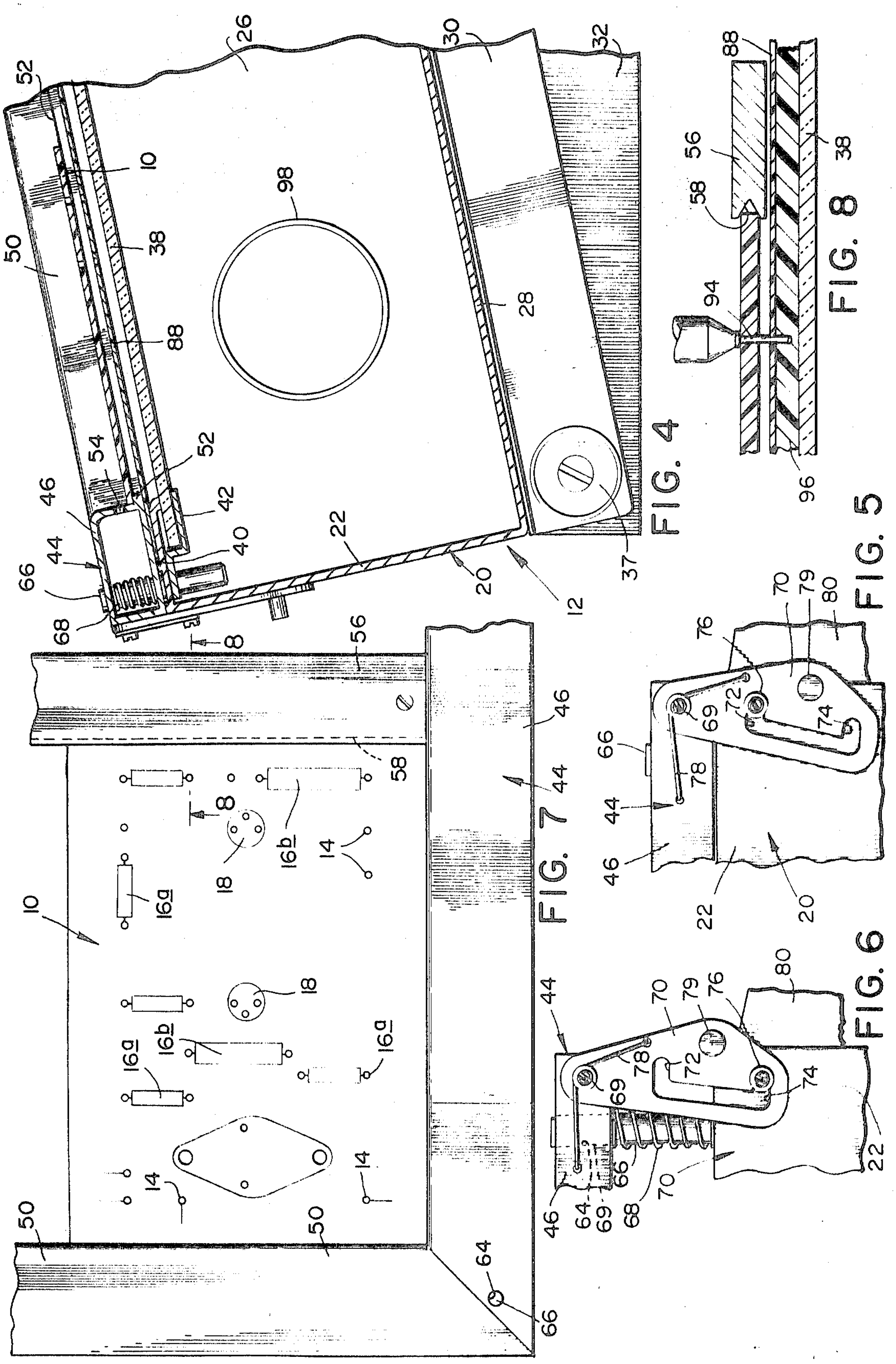
FIG. 4 is a fragmentary, vertical, sectional view taken on line 4—4 of FIG. 1, showing the apparatus in tilted position.
FIGS. 5 and 6 are fragmentary, elevational views of an upper corner of the apparatus showing the means for holding the circuit board supporting frame in lowered and raised positions, respectively.
FIG. 7 is a fragmentary top plan view of the apparatus showing, more or less diagrammatically, a printed circuit board supported thereon ready for processing.
FIG. 8 is a fragmentary section taken on line 8—8 of FIG. 7.

The apparatus 12 comprises an open-top box 20, having front and rear walls 22 and 24, side walls 26, and a bottom wall 28. The box 20 may have angle bars 30, secured by one side to the bottom wall 28 along its sides and may be tiltably supported, by angle bars 30, on a base 32, as by nut and bolt assembly 34, which passes through the angle bar at the front of the box and through an oppositely-directed angle bracket 36, mounted on the base 32 (FIGS. 5 and 6).

Means may be provided at the top of box 20 to support a glass plate 38, across the box opening. Such means may comprise inwardly-extending flanges 40, of the front and rear walls 22 and 24, and Z-shaped bars 42, secured to flanges 40; the glass being held between the flanges 40 and a leg of the Z-shaped bars 42.

Supported across the top of the box is a frame, generally designated as 44, consisting of front and rear sections 46 and 48, and side sections 50. The frame is hollow and preferably of substantially rectangular cross-section and preferably formed of metal. The bottom wall of all or some of the frame sections is formed with a projection 52, extending inwardly of their inner walls to form a shelf on which a printed circuit board 10 may be rested.

The inner face of front and rear frame sections 46 and 48 may be formed with longitudinally-extending slots 54, in elevated relation relative to the shelf 52 in which may be reciprocated the ends of a bar 56, formed with a groove 58, in at least one of its side edges which may serve to support an edge of a circuit board 10 when it is of lesser length than the frame 42. The ends of bar 56 may preferably have connected to them elongated transverse pieces 60, which may serve to maintain bar 56 in normal relation to the frame sections 46 and 48, as the bar is reciprocated to adjust the frame opening to accommodate shorter boards 10 of varying length.

The frame 42 may be mounted in a manner permitting the raising and lowering thereof relative to the top of the box 20 as to permit of setting of components with longer or shorter terminals. This may be accomplished by means of vertically-extending openings 64, formed in the frame, at each corner thereof, preferably through the ends of the front and rear sections 46 and 48 of the frame. The frame is mounted by the openings 64 over correspondingly-positioned posts 66, rising from the flanges 40 of the front and rear walls of the box 20. An expansion spring 68 is mounted over each post 66 between the box 20 and the frame 42, that normally tends to maintain the frame in elevated relation above box 20. To maintain the frame in lowermost position on the box there is pivotally suspended by one end, as at 69, from the outer wall of front and rear frame sections 46 and 48, a latch plate 70, having a substantially U-shaped slot formed therein with its elongated web portion 72, extending in a substantially vertical direction, and its side portions 74, being offset in the same, lateral direction.

The latch plate 70 is pivotally supported at its upper end, and the slots 72–74 guide upon a screw-headed pin 76, set into the wall of the box, so that when the frame is in elevated position, due to the tension of springs 68, the lower side portion 74 of each slot may be moved into engagement over the pin 76, and when it is desired to maintain the frame in lowermost position, the lower slot portion 74 may be released from pin 76 and the frame pressed down until pin 76 is disposed at the upper end of slot portion 72 and the latch plate 70 is then moved to engage the pin within upper slot side portion 74. Engagement of the pin 76 in the side portions 74 of the slot may be automatically effected by a torsion spring 78, mounted over pivot pin 69, in the frame with one end of the spring engaged in a suitably-located opening in the latch plate 70 and the other end engaged in a suitably-located opening in the outer wall of the adjacent frame section. The latch plates 70 may each have a finger piece or stud 79, set thereinto by which it may be manually moved to disengage its end slot portion 74 from pin 76.

Secured to each side wall 26 are a pair of laterally-extending, spaced, parallel brackets 80, each having an inwardly-extending slot 82, formed in its end edge adapted to receive and serve as a bearing for the ends of a roller 84. Each bracket 80 is provided with a snap-clip 86, secured against its inner surface adapted to snap over and retain the roller 84 in place. Each roller 84 has secured to it one end of a roll of opaque film 88, preferably of a thermoplastic character, which extends across the opening of a box 20 above glass 38 and between flange 40 of the box and the underside of the frame 44; the film being confined, by its edges, between the guide discs 90, adjacent each end of roller 84. Rollers 84 may have knobs 92, on their ends for rotating the roller in either direction.

Illuminating means are disposed within box 20, below film 88, as in the form of a fluorescent light tube schematically indicated at 98 (FIG. 4); provided with means for connecting it in an electric circuit.

To set the component of a printed circuit board 10, one specimen of an unset or blank circuit board with the locations of the various components and especially the openings for their terminal posts located therein by openings in the board, is set in the opening of the frame 44 with the edges of the board resting on the flanges 52 and in the groove 58 of bar 56, which is adjusted in place to support one of the board edges. Means, such as an electrically-heated needle 94 (FIG. 8), is then used to form holes in the film corresponding in position to the openings in the board 10.

In the method of the present invention, the openings for each of the several types of components are formed in separate areas of the film. Thus, the openings for component 14 are formed in the area designated in the drawings as 14 on the film; the openings for component **16*a* are formed in the area designated at 16*a*; the openings formed for component 16*b* may be formed in the area designated on the film as 16*b*; and the openings for component 18 may be formed in the area designated as 18 in the film. It may here be stated that in order to ensure the formation of clear and sharp openings in the film, a resilient pad 96, as of foam plastic material, may be interposed between the film 88 and the glass 38** (FIG. 8), this pad being removed after the formation of the guide openings in the film are completed.

In order to assemble a group of printed circuit boards 10 corresponding to the master board used in preparing the guide film 88, with their electronic components, such boards are each successively mounted on the frame 44 in the same position as the master board and the illuminating means 98 lit up. The film 88 is then moved until one of the perforated areas thereof underlies the board 10, and is then adjusted so that the openings in that film register with the openings of the corresponding electronic components in the board. In this position, the light from the illuminating means 98 which passes through the openings in the underlying film area are visible to the operator only through the corresponding openings for the type of component related to the film are in the overlying printed circuit board. The operator may then take the appropriate electronic component from a bin which may be marked to correspond with the markings on the film area, either by number or color, and place such component into the board openings through which light is visible to the operator. After all light-transmitting openings in the board for that film area have been filled by setting thereinto the terminals of the appropriate posts of the electronic components, the film is moved to present another perforated area thereof below the printed circuit board and is adjusted in position until the openings of that second area transmit light into the corresponding openings in the printed circuit board for receiving the terminal posts of a second electronic component. The operator then takes such second components from another bin marked either by number of color to correspond to the number or color of such second film area, and sets such components into the printed circuit board, and then successively moves the film on to a third, fourth and any additional areas in the film until all of the different components are set into the circuit board. This procedure may then be followed with each circuit board in the group.

Figure 9:
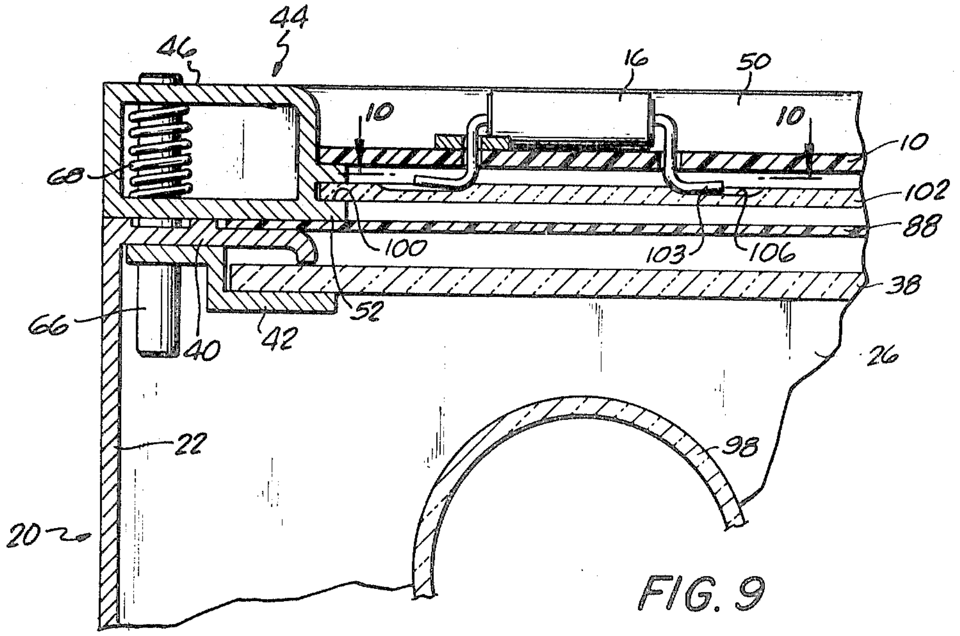
FIG. 9 is a fragmentary, vertical, sectional view similar to that of FIG. 4, on an enlarged scale, of a modified embodiment of the apparatus of the invention.
Figure 10:
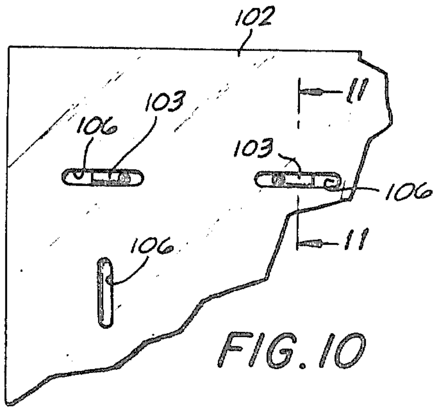
FIG. 10 is a fragmentary plan view taken on the plane of line 10—10 of FIG. 9.
Figure 11:
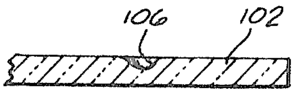
FIG. 11 is a section taken on line 11—11 of FIG. 10.

In FIGS. 9–11, inclusive, there is shown a modified form of the apparatus of the invention, capable of providing additional important advantages, in that, in its lesser capacity, it insures against the displacement of the components from a board after it is removed from the apparatus for connection of the ends of the lead wires of the components to their appropriate terminals in the circuit, by deflecting the projecting ends of such lead wires before removal of the board, and, in its greater capacity, may also deflect such projecting ends in the direction of the terminals to which they are to be connected, to make such connection easier and more rapid.

To attain the foregoing additional advantages, a channel 100 is formed in the inner wall of each of two opposed sides of frame 44; preferably in the longitudinal sides 46 and 48 thereof, below the board supporting ledges 52 of such sides, in which may be supported a rigid, transparent plate, as of clear glass 102. The channels 100 may be arranged to support plate 102 at a distance from the supper surface of a ledge 52 that is less than the length of the shortest lead wire end 103, projecting from the underside of a board 10 (FIG. 9). The plate 102 may be insertable and removable from its position in channel 100 through an appropriately positioned slot formed through the upright sides of one of the other pairs of frame sides, as in a frame side 50, in a manner that will be clear to anyone skilled in the art and not thought necessary to be shown.

It will be clear that by the provision of clear, transparent plate 102, which will not interfere with the illumination of the openings 14 in the board 10, the projecting lead wire ends 103 of any component 16, inserted through openings 14 provided therefor, will engage against the surface of plate 102, and, when pressure is applied to the component, will be deflected by plate 102 and thereby be inhibited against displacement from its opening 14. And it may here be stated that such lead wire ends deflecting pressure may be applied individually to each component as it is set in place on the board 10, or simultaneously to a group or all components of the board, after they are all set in place, by means of a plate or board pressed simultaneously against all such components from above.

Where desired, grooves, such as 106, may be formed in the surface of plate 102, each groove 106 having one end arranged to register with an opening 14 for a lead wire and extending in the direction of the terminal to which such lead wire is to be connected; thereby not only deflecting the end 103 of such lead wire against displacement from the board, but also deflecting it, when its end enters the groove 106, in the appropriate direction for connection to its intended terminal.

This completes the description of the method and apparatus of the present invention for assembling printed circuit boards with their electronic components. It will be readily apparent that the method and apparatus of the present invention are simple and easy to practice and use, even by operators with a minimum of training, and even if illiterate. It will also be apparent that the practice and use of such methods and apparatus greatly increases the speed and accuracy with whichr printed circuit boards may be assembled with their electronic components, to thereby greatly increase the economy of producing assembled printed circuit boards.

It will be further apparent that numerous variations and modifications may be made in the method and apparatus for assembling printed circuit boards with their electronic components of the present invention, by anyone skilled in the art, in accordance with the principles of the present invention hereinabove set forth, without the exercise of any inventive ingenuity.

What we claim is:

1. Apparatus for use in the forming of a template for the setting of a variety of electronic components into a printed circuit board, each type having a different arrangement of lead wires from that of the other types, said board having openings for receiving said lead wires, said apparatus comprising an open top housing, a rigid, light transmitting pane provided on said housing at its said top opening, a light source within said housing below said pane, means associated with said housing for supporting a printed circuit board above said pane in spaced parallel relation thereto, and a pair of rollers at two opposed ends of said frame adapted to have the ends of a roll of opaque sheet material disposed between said board supporting means and said pane secured thereto for reciprocal movement of said roll of material.

2. The apparatus of claim 1, wherein said means supporting said board comprises an open center frame supported on said housing, said frame including at least two sides having inwardly-extending ledges on which said board may be rested by marginal edge portions thereof.

3. The apparatus of claim 2, wherein means are provided on said frame for adjusting the opening thereof for supporting boards of different sizes.

4. The apparatus of claim 3, wherein means are provided for supporting said frame in adjustable position above said housing.

5. The apparatus of claim 1 including a clear transparent, rigid plate supported thereon below said board-supporting means in position to overlie a roll of sheet material connected to said rollers.

6. The apparatus of claim 3, including a clear, transparent, rigid plate and means on said frame for removably supporting said plate below said board-supporting ledges.

7. The apparatus of claim 6, wherein said transparent plate is different for each different printed circuit board and is formed with grooves in its surface, each said groove having one end thereof in register with a lead wire opening in the circuit board, and extends in the direction of the terminal to which the lead wire to be passed therethrough is to be connected.

8. The apparatus of claim 1, wherein a roll of opaque sheet material is mounted thereon with its ends connected to said rollers, and said material is formed with a plurality of differently perforated areas, the perforations of each said area arranged to register with the openings in said board for receiving the lead wires for the components of a different one of said types.

9. The apparatus of claim 8, wherein each said area has indicia provided thereon adapted to identify the type of components whose setting into said board are guided by the perforations in the openings of said area.

References Cited

UNITED STATES PATENTS

| | | | |
|---|---|---|---|
| 3,372,455 | 3/1968 | Howie | 29—407 X |
| 3,216,101 | 11/1965 | Miller | 29—407 |
| 2,959,848 | 11/1960 | Savitt | 29—203 B |

FRANCIS S. HUSAR, Primary Examiner

U.S. Cl. X.R.

29—407, 626; 353—95